US009853182B2

United States Patent
Choi et al.

(10) Patent No.: US 9,853,182 B2
(45) Date of Patent: Dec. 26, 2017

(54) GALLIUM NITRIDE-BASED LIGHT EMITTING DIODE

(71) Applicants: SEOUL VIOSYS CO., LTD., Ansan-si (KR); MITSUBISHI CHEMICAL CORPORATION, Chiyoda-ku (JP)

(72) Inventors: Seung Kyu Choi, Ansan-si (KR); Chae Hon Kim, Ansan-si (KR); Jung Whan Jung, Ansan-si (KR); Ki Bum Nam, Ansan-si (KR); Kenji Shimoyama, Ushiku (JP); Kaori Kurihara, Ushiku (JP)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/467,470

(22) Filed: Aug. 25, 2014

(65) Prior Publication Data
US 2014/0361247 A1  Dec. 11, 2014

Related U.S. Application Data

(63) Continuation of application No. PCT/KR2013/001258, filed on Feb. 18, 2013.

(30) Foreign Application Priority Data

Feb. 24, 2012 (KR) .................. 10-2012-0019011

(51) Int. Cl.
*H01L 33/00* (2010.01)
*H01L 33/06* (2010.01)
(Continued)

(52) U.S. Cl.
CPC .......... *H01L 33/0025* (2013.01); *H01L 33/06* (2013.01); *H01L 33/12* (2013.01); *H01L 33/0075* (2013.01); *H01L 33/32* (2013.01)

(58) Field of Classification Search
CPC ...... H01L 33/06; H01L 33/12; H01L 33/0025
(Continued)

(56) References Cited

U.S. PATENT DOCUMENTS 7,888,670 B2   2/2011   Han et al.
8,669,546 B2   3/2014   Kotani
(Continued)

FOREIGN PATENT DOCUMENTS

JP   2003-23216 A   1/2003
JP   2006-135001 A  5/2006
(Continued)

OTHER PUBLICATIONS

International Search Report dated May 29, 2013 in PCT/KR2013/001258 filed Feb. 18, 2013.
(Continued)

*Primary Examiner* — Christine Enad
(74) *Attorney, Agent, or Firm* — Oblon, McClelland, Maier & Neustadt, L.L.P.

(57) ABSTRACT

Disclosed herein is a light emitting diode (LED) including: a gallium nitride substrate; a gallium nitride-based first contact layer disposed on the gallium nitride substrate; a gallium nitride-based second contact layer; an active layer having a multi-quantum well structure and disposed between the first and second contact layers; and a super-lattice layer having a multilayer structure and disposed between the first contact layer and the active layer. By employing the gallium nitride substrate, the crystallinity of the semiconductor layers can be improved, and in addition, by disposing the super-lattice layer between the first contact layer and the active layer, a crystal defect that may be generated in the active layer can be prevented.

14 Claims, 9 Drawing Sheets

(51) Int. Cl.
*H01L 33/12* (2010.01)
*H01L 33/32* (2010.01)

(58) Field of Classification Search
USPC .......................................................... 257/13
See application file for complete search history.

(56) References Cited

U.S. PATENT DOCUMENTS

| | | | |
|---|---|---|---|
| 2002/0105986 A1 | 8/2002 | Yamasaki | |
| 2005/0040414 A1* | 2/2005 | Hirayama | H01L 33/0075 257/97 |
| 2007/0096142 A1* | 5/2007 | Tachibana | B82Y 20/00 257/103 |
| 2008/0251781 A1* | 10/2008 | Han et al. | 257/13 |
| 2009/0065762 A1* | 3/2009 | Lee | H01L 33/32 257/13 |
| 2009/0068822 A1* | 3/2009 | Kim | C30B 25/02 438/503 |
| 2009/0072252 A1* | 3/2009 | Son et al. | 257/94 |
| 2010/0025653 A1* | 2/2010 | Soh | B82Y 10/00 257/13 |
| 2010/0252835 A1* | 10/2010 | Horie | C30B 25/02 257/76 |
| 2011/0001126 A1* | 1/2011 | Kamikawa et al. | 257/14 |
| 2011/0163323 A1* | 7/2011 | Motoki | C30B 25/00 257/76 |
| 2011/0175201 A1* | 7/2011 | Tokuyama | H01L 21/28575 257/615 |
| 2011/0244663 A1* | 10/2011 | Su | C23C 16/301 438/478 |
| 2012/0070929 A1* | 3/2012 | Hashimoto et al. | 438/46 |
| 2013/0001512 A1* | 1/2013 | Kotani | 257/13 |
| 2013/0256687 A1* | 10/2013 | Saito | H01L 33/12 257/76 |

FOREIGN PATENT DOCUMENTS

| | | |
|---|---|---|
| JP | 2006-332365 A | 12/2006 |
| JP | 2008-235803 A | 10/2008 |
| JP | 2008-270805 A | 11/2008 |
| JP | 2011-14746 | 1/2011 |
| JP | 2011-187621 | 9/2011 |
| KR | 10-0835116 | 6/2008 |
| WO | WO 2010125850 A1 * | 11/2010 |
| WO | WO 2010/150809 A1 | 12/2010 |

OTHER PUBLICATIONS

U.S. Appl. No. 14/582,591, filed Dec. 24, 2014, Kurihara, et al.
Office Action dated Jan. 5, 2016 in Japanese Patent Application No. 2014-558672 (with English language translation).

* cited by examiner

GALLIUM NITRIDE-BASED LIGHT EMITTING DIODE

This is a continuation of International Application PCT/KR2013/001258, filed on Feb. 18, 2013, and designated the U.S., and claims priority from Korean Patent Application 10-2012-0019011 which was filed on Feb. 24, 2012, the entire contents of which are incorporated herein by reference.

TECHNICAL FIELD

The present invention relates to a gallium nitride-based light emitting diode and, more particularly, to a gallium nitride-based light emitting diode using a gallium nitride substrate as a growth substrate.

BACKGROUND ART

In general, nitride of a group III element, such as gallium nitride (GaN), having excellent thermal stability and a direct-transition type energy band structure, has recently come to prominence as a material for a light emitting element in a visible ray and ultraviolet region. In particular, blue and green light emitting elements using indium gallium nitride (InGaN) are utilized in various applications such as a large-scale full color flat panel display device, a traffic light, interior illumination, a high density light source, a high resolution output system, optical communication, and the like.

Since it is difficult to fabricate a homogenous substrate for growing a semiconductor layer made of nitride of a group III element, the semiconductor layer made of nitride of a group III element is generally grown on a heterogeneous substrate having a similar crystal structure through metal organic chemical vapor deposition (MOCVD), molecular beam epitaxy (MBE), or the like. As the heterogeneous substrate, a sapphire substrate having a hexagonal structure is commonly used.

However, an epitaxial layer grown on the heterogeneous substrate has a relatively high dislocation density due to a lattice mismatch and a difference in thermal expansion coefficients with the growth substrate. The epitaxial layer grown on the sapphire substrate is known to generally have a dislocation density of $1E8/cm^2$ or more. Thus, there is a limitation in improving luminous efficiency of a light emitting diode (LED) by the epitaxial layer having such a high dislocation density.

In addition, when the LED is operated with a high current, since the current is concentrated through dislocation, luminous efficiency is further reduced in comparison to an operation of the LED with a low current.

SUMMARY OF THE INVENTION

An object of the present invention is to provide a light emitting diode having improved luminous efficiency.

Another object of the present invention is to provide a light emitting diode that may be driven with a high current.

Still another object of the present invention is to provide a light emitting diode capable of reducing a forward voltage.

According to an exemplary embodiment of the present invention, there is provided a light emitting diode (LED) including: a gallium nitride substrate; a gallium nitride-based first contact layer disposed on the gallium nitride substrate; a gallium nitride-based second contact layer disposed at an upper portion of the first contact layer; an active layer having a multi-quantum well structure and disposed between the first and second contact layers; and a super-lattice layer having a multilayer structure and disposed between the first contact layer and the active layer.

In some embodiments, the super-lattice layer having a multilayer structure may have a structure in which an InGaN layer, an AlGaN layer, and a GaN layer are repeatedly stacked in a plurality of cycles. The super-lattice layer having a multilayer structure may further include a GaN layer between the InGaN layer and the AlGaN layer in each cycle.

In some embodiments, the active layer having a multi-quantum well structure may include (n−1) number of barrier layers disposed between a first well layer closest to the first n type contact layer and nth well layer closest to the second p type contact layer, and among the (n−1) number of barrier layers, barrier layers having a thickness greater than an average thickness of the (n−1) number of barrier layers may be disposed to be closer to the first well layer and barrier layers having a thickness smaller than the average thickness of the (n−1) number of barrier layers may be disposed to be closer to the nth well layer. In addition, the number of barrier layers having a thickness greater than the average thickness may be greater than that of the barrier layers having a thickness smaller than the average thickness.

The barrier layers within the active layer may be made of AlGaN or AlInGaN. Also, a composition ratio of aluminum (Al) in the barrier layers may be greater than 0 and smaller than 0.1. In particular, the composition ratio of Al in the barrier layers may be, preferably, 0.01 or greater, and more preferably, 0.02 or greater, and preferably, 0.05 or smaller.

In some embodiments, the LED may further include a medium temperature buffer layer disposed between the substrate and the n type contact layer. Here, the middle temperature buffer layer may be a GaN layer as a gallium nitride-based layer grown at a growth temperature ranging from 700° C. to 800° C. on the gallium nitride substrate.

In some embodiments, the LED may further include: a lower GaN layer disposed between the substrate and the n type contact layer; and an intermediate layer disposed between the n type contact layer and the lower GaN layer. Here, the intermediate layer may be formed of an AlInN layer or an AlGaN layer.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

MODE FOR CARRYING OUT THE INVENTION

Embodiments of the present invention will now be described in detail with reference to the accompanying drawings. These embodiments are provided so that this disclosure will be thorough and complete, and will fully convey the concept of the invention to those skilled in the art. The embodiments of the present invention may be modified in many different forms and the scope of the invention should not be limited to the embodiments set forth herein. In the drawings, the shapes and dimensions may be exaggerated for clarity, and the same reference numerals will be used throughout to designate the same or like components.

Figure 1:
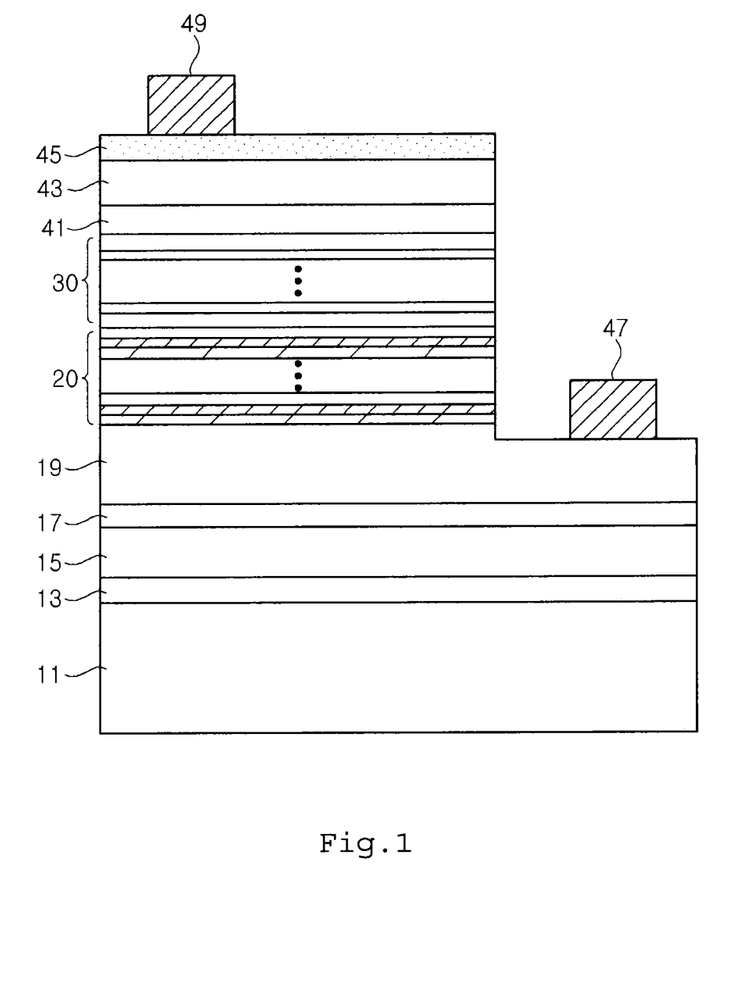
FIG. 1 is a cross-sectional view of a light emitting diode (LED) according to an embodiment of the present invention.

FIG. 1 is a cross-sectional view of a light emitting diode (LED) according to an embodiment of the present invention.

With reference to FIG. 1, the LED includes a gallium nitride substrate 11, an n type contact layer 19, a super-lattice layer 20, an active layer 30, and a p type contact layer 43. In addition, the LED may include a middle temperature buffer layer 13, a lower GaN layer 15, an intermediate layer 17, a p type clad layer 41, a transparent electrode layer 45, a first electrode 47, and a second electrode layer 49.

The gallium nitride substrate 11 may have a growth plane of a c plane, an m plane or an a plane. Also, the growth plane of the gallium nitride substrate 11 may have a tilt angle to help an epitaxial layer grow. The gallium nitride substrate 11 may be fabricated by using, for example, a hydride vapor phase epitaxy (HVPE) technique.

The middle temperature buffer layer 13 may be formed on the gallium nitride substrate 11. The middle temperature buffer layer 13 may be formed to have a thickness ranging from about 2 nm to 10 nm at a temperature ranging from about 700° C. to 800° C.

Conventionally, in order to grow a gallium nitride-based epitaxial layer on a substrate, a technique of forming a low temperature buffer layer at a temperature of 600° C. or lower has been used. A gallium nitride-based epitaxial layer can be grown on a sapphire substrate having a significant difference in lattice mismatch and thermal expansion coefficient by means of the low temperature buffer layer. However, the gallium nitride substrate 11 is a homogeneous substrate with the gallium nitride epitaxial layer, so it does not require a low temperature buffer layer. In addition, if a low temperature buffer layer is formed on the gallium nitride substrate 11, dislocation density generated within the gallium nitride layer grown thereon would be rather increased, which is, thus, not desirous.

Meanwhile, growing a gallium nitride epitaxial layer directly from the gallium nitride substrate 11 at a high temperature of 900° C. or higher may be considered. However, when the gallium nitride substrate 11 has a non-polar growth plane such as an m plane or an a plane, an epitaxial layer grown from the gallium nitride substrate 11 at high temperature has a very rough surface. In comparison, when the buffer layer 13 is grown at a temperature ranging from 700° C. to 800° C. and an epitaxial layer is grown from the buffer layer 13, the epitaxial layer grown from the buffer layer 13 can have a smooth surface.

The lower GaN layer 15 may be made of undoped GaN or Si-doped GaN. When the middle temperature buffer layer 13 is formed, the lower GaN layer 15 may be grown from the middle temperature buffer layer 13, and when the middle temperature buffer layer 13 is omitted, the lower GaN layer 15 may be directly grown from the gallium nitride substrate 11.

The intermediate layer 17 is disposed on the lower GaN layer 15. The intermediate layer 17 is formed as a gallium nitride-based epitaxial layer having a composition different from that of the gallium nitride substrate 11 and has a wider band gap than that of a well layer having a multi-quantum well structure. For example, the intermediate layer 17 may be made of AlInN, AlGaN, or AlInGaN. The n type contact layer 19 and the lower GaN layer 15 are grown at a high temperature of about 1000° C., while the intermediate layer 17 is grown at a temperature ranging from about 800° C. to 900° C. By forming the intermediate layer 17 having a different composition from that of GaN between the GaN layers 15 and 19, strain may be caused in the n type contact layer 19 formed on the intermediate layer 17, thereby improving crystallinity of the multi-quantum well structure.

The n type contact layer 19 may be made of Si-doped GaN. The n type contact layer 19 may be grown from the intermediate layer 17, but the present invention is not limited thereto. The n type contact layer 19 may be directly grown from the middle temperature buffer layer 13 or from the gallium nitride substrate 11. The first electrode 47 is in ohmic-contact with the n type contact layer 19.

Figure 2:
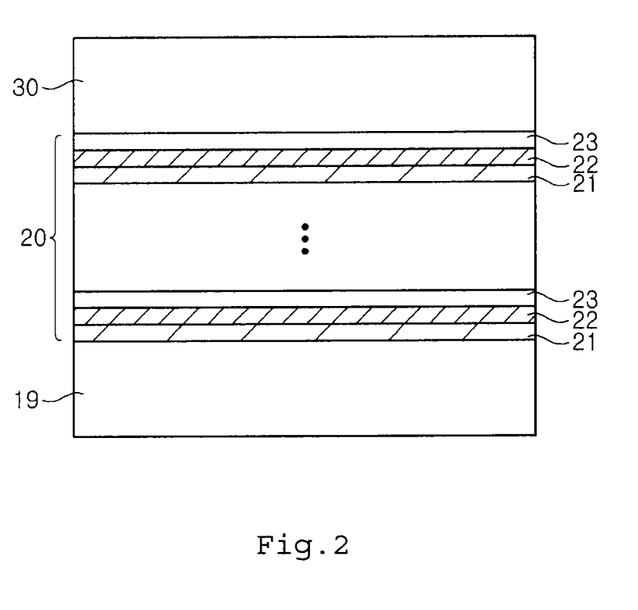
FIG. 2 is a cross-sectional view of a super-lattice layer according to an embodiment of the present invention.

Meanwhile, the super-lattice layer 20 having a multilayer structure is disposed on the n type contact layer 19. The super-lattice layer 20 is interposed between the n type contact layer 19 and the active layer 30, and thus, it is positioned in a current path. The super-lattice layer 20 may be formed by repeatedly stacking a pair of InGaN and GaN in a plurality of cycles (e.g., 15 to 20 cycles), but the present invention is not limited thereto. For example, as shown in FIG. 2, the super-lattice layer 20 may have a structure in which a tri-layer structure of InGaN layer 21/AlGaN layer 22/GaN layer 23 is repeatedly stacked in a plurality of cycles (e.g., about 10 to 20 cycles). The sequence of the AlGaN layer 22 and the InGaN layer 21 may be interchanged. Here, the InGaN layer 21 has a wide band gap in comparison to a well layer in the active layer 30. Also, preferably, the AlGaN layer 22 has a wide band gap in comparison to a barrier layer in the active layer 30. In addition, the InGaN layer 21 and the AlGaN layer 22 may be formed as undoped layers on which impurities are not intentionally doped, while the GaN layer 23 may be formed as a Si-doped layer. Preferably, the uppermost layer of the super-lattice layer 20 is the impurity-doped GaN layer 23.

Since the super-lattice layer 20 includes the AlGaN layer 22, holes in the active layer 30 can be prevented from moving toward the n type contact layer 19, thus enhancing radiative recombination rate in the active layer 30. The AlGaN layer 22 may be formed to have a thickness smaller than 1 nm.

Figure 3:
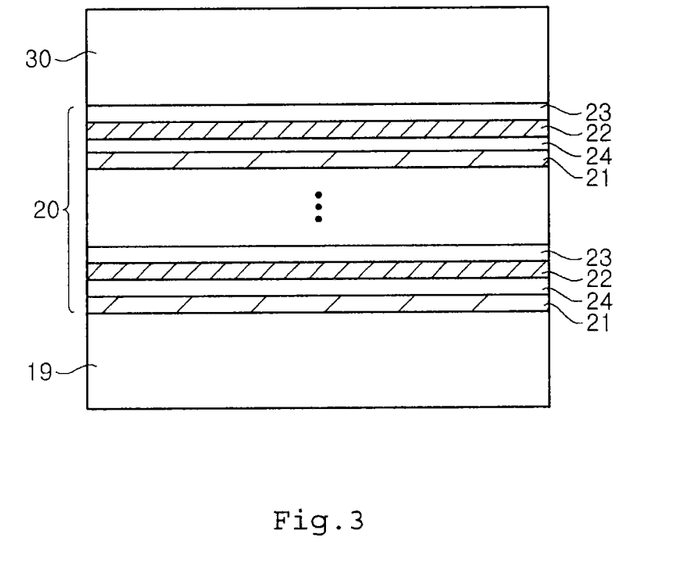
FIG. 3 is a cross-sectional view of a super-lattice layer according to another embodiment of the present invention.

Meanwhile, in the super-lattice layer 20, since the AlGaN layer 22 is formed on the InGaN layer 21, a lattice mismatch is high therebetween, which readily forms a crystal defect on the interface. Thus, as shown in FIG. 3, a GaN layer 24 may be inserted between the InGaN layer 21 and the AlGaN layer 22. The GaN layer 24 may be formed as an undoped layer or a Si-doped layer.

Figure 4:
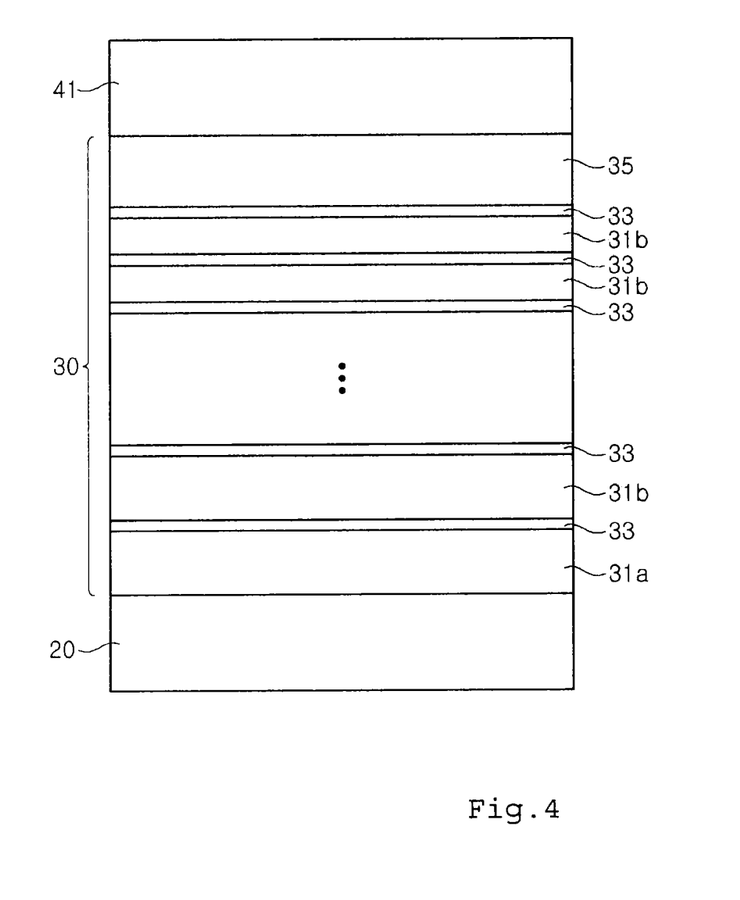
FIG. 4 is a cross-sectional view of an active layer according to an embodiment of the present invention.

The active layer 30 having a multi-quantum well structure is disposed on the super-lattice layer 20. As shown in FIG. 4, the active layer 30 has a structure in which the barrier layers 31a and 31b and well layers 33n, 33, and 33p are alternately stacked. Here, 33n denotes a well layer (a first well layer) closest to the super-lattice layer 20 or the n type contact layer 19, and 33p denotes a well layer (an nth well layer) closest to the p type clad layer 41 or the p type contact layer 23. Meanwhile, FIG. 5 shows an energy band of the active layer 30.

Figure 5:
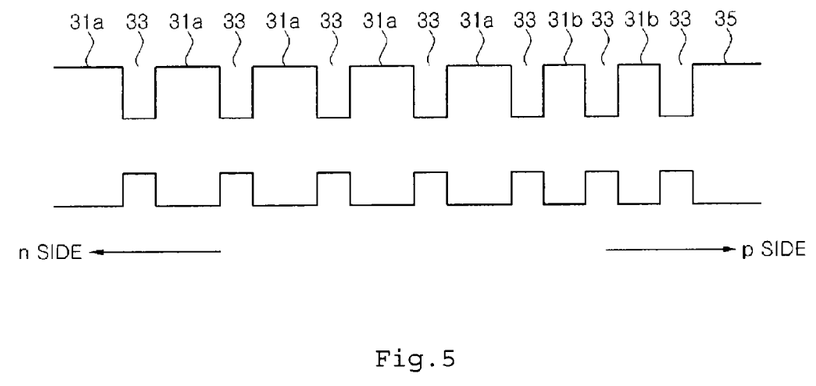
FIG. 5 is a view showing an energy band for explaining the active layer of FIG. 4.

With reference to FIGS. 4 and 5, (n−1) number of barrier layers 31a and 31b and (n−2) number of well layers 33 are alternately stacked between the well layer 33n and the well layer 33p. The barrier layers 31a has a thickness greater than an average thickness of the (n−1) number of barrier layers 31a and 31b, and the barrier layers 31b has a thickness smaller than the average thickness. Also, as illustrated, the barrier layers 31a are disposed to be closer to the first well layer 33n, and the barrier layers 31b are disposed to be closer to the nth well layer 33p.

In addition, the barrier layer 31a may be disposed to be in contact with the uppermost layer of the super-lattice layer 20. Namely, the barrier layer 31a may be positioned between the super-lattice layer 20 and the first well layer 33n. Also, a barrier layer 35 may be disposed on the nth well layer 33p. The barrier layer 35 may have a thickness greater than that of the barrier layer 31a.

By reducing the thickness of the barrier layers 31b closer to the nth well layer 33p, a resistance component of the active layer 30 can be reduced, holes injected from the p type contact layer 43 can be distributed to the well layers 33 in the active layer 30, and accordingly, a forward voltage of the LED can be lowered. Also, by increasing the thickness of the barrier layer 35, a crystal defect generated while the active layer 30, in particular, the well layers 33n, 33, and 33p, is/are grown can be healed to improve the crystal structure of the epitaxial layers formed thereon. In this case, however, if a larger number of barrier layers 31b than that of the barrier layers 31a are formed, a defective density in the active layer 30 may be increased to reduce luminous efficiency. Thus, preferably, a larger number of barrier layers 31a than that of the barrier layers 31b are formed.

Meanwhile, the well layers 33n, 33, and 33p may have a substantially equal thickness, and accordingly, light having a very small full width at half maximum (FWHM) can be emitted. Alternatively, light having a relatively large FWHM may be obtained by differently adjusting the thicknesses of the well layers 33n, 33, and 33p. In addition, the thickness of the well layer 33 positioned between the barrier layers 31b may be reduced in comparison to the thickness of the well layer 33 positioned between the barrier layers 31a, to prevent a generation of a crystal defect. For example, the thicknesses of the well layers 33n, 33, and 33p may range from 10 Å to 30 Å, the thickness of the barrier layers 31a may range from 50 Å to 70 Å, and the thickness of the barrier layers 31b may range from 30 Å to 50 Å.

Also, the well layers 33n, 33, and 33p may be formed as gallium nitride-based layers emitting near ultraviolet (UV) ray or light of a blue region. For example, the well layers 33n, 33, and 33p may be made of InGaN, and in this case, a composition ratio of indium (In) may be adjusted according to a requested wavelength.

Meanwhile, in order to confine electrons and holes within the well layers 33n, 33, and 33p, the barrier layers 31a and 31b may be formed as gallium nitride-based layers having a band gap wider than that of the well layers 33n, 33, and 33p. For example, the barrier layers 31a and 31b may be made of GaN, AlGaN, or AlInGaN. In particular, the barrier layers 31a and 31b may be formed as gallium nitride-based layers containing aluminum (Al) to have a further increased band gap. Preferably, a composition ratio of aluminum (Al) in the barrier layers 31a and 31b is greater than 0 and smaller than 0.1. In particular, it may range from 0.02 to 0.05. An optical power can be increased by limiting the composition ratio of aluminum (Al) to the foregoing range.

In addition, although not shown, a cap layer may be formed between the respective well layers 33n, 33, and 33p and the barrier layers 31a and 31b positioned thereon. The cap layer is formed to prevent the well layers from being damaged while the temperature of a chamber is increased to grow the barrier layers 31a and 31b. For example, the well layers 33n, 33, and 33p may be grown at a temperature of about 780° C., and the barrier layers 31a and 31b may be grown at a temperature of about 800° C.

The p type clad layer 41 is disposed on the active layer 30 and may be made of AlGaN. Alternatively, the p type clad layer 41 may have a super-lattice structure in which InGaN and AlGaN are repeatedly stacked. The p type clad layer 41 is an electron block layer, preventing electrons from moving to the p type contact layer 43, thus improving luminous efficiency.

With reference back to FIG. 1, the p type contact layer 43 may be made of Mg-doped GaN. The p type contact layer 43 is disposed on the p type clad layer 41. Meanwhile, the transparent conductive layer 45 such as ITO or ZnO is formed on the p type contact layer 43 and is in ohmic-contact with the p type contact layer 43. The second electrode 49 is electrically connected to the p type contact layer 43. The second electrode 49 may be connected to the p type contact layer 43 through the transparent conductive layer 45.

Meanwhile, portions of the p type contact layer 43, the p type clad layer 41, the active layer 30, and the super-lattice layer 20 may be removed through an etching process to expose the n type contact layer 19. The first electrode 47 is formed on the exposed n type contact layer 19.

In this embodiment, the middle temperature buffer layer 13 and the epitaxial layers 15 to 43 grown from the gallium nitride substrate 11 may be formed by using an MOCVD technique. Here, TMAl, TMGa, and TMIn may be used as sources of Al, Ga, and In, respectively, and $NH_3$ may be used as a source of N. Also, $SiH_4$ may be used as a source of Si, an n type impurity, and $Cp_2Mg$ may be used as a source of Mg, a p type impurity.

Experimental Example 1

Figure 6:
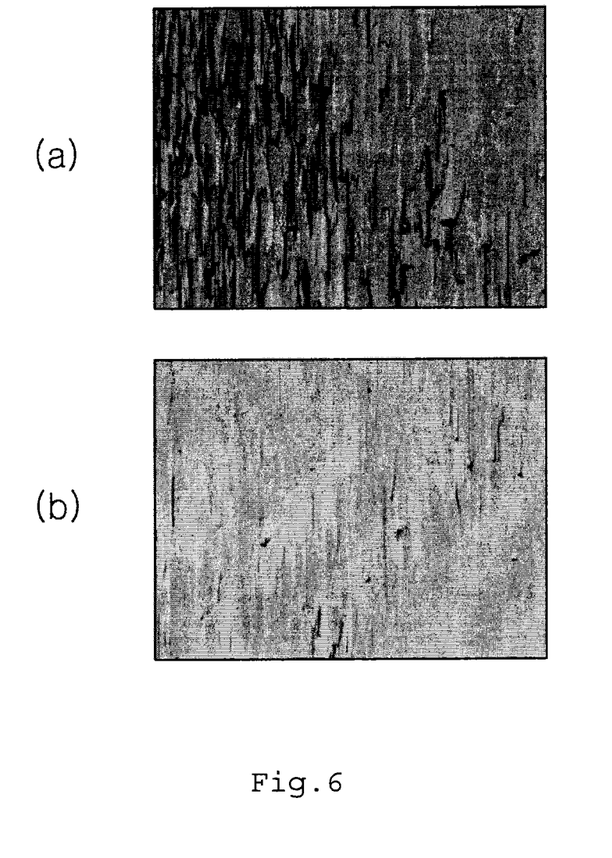
FIG. 6 is an optical photograph for explaining a surface morphology of an epitaxial layer according to the use of a middle temperature buffer layer.

FIG. 6 is an optical photograph for explaining a surface morphology of an epitaxial layer according to the use of the middle temperature buffer layer 13. In FIG. 6, (a) is a surface photograph of an n type GaN layer grown from the gallium nitride substrate 11 without the middle temperature buffer layer 13, and (b) is a surface photograph of an n type GaN layer grown from the middle temperature buffer layer 13 after the middle temperature buffer layer 13 was formed on the gallium nitride substrate 11.

Here, as the gallium nitride substrate 11, a substrate having a grown plane of an m plane was used, and the middle temperature buffer layer 13 was formed to have a thickness of about 5 nm at a temperature of about 750° C.

With reference to FIG. 6(a), it can be seen that, when the n type GaN layer is directly grown without forming the middle temperature buffer layer 13, the n type GaN layer has a considerably rough surface. This is because a crystallization direction of the GaN layer grown from the gallium nitride substrate 11 is locally changed, the epitaxial layer has a rough surface. The exact reason why the epitaxial layer having a rough surface is grown in case of using the homogeneous substrate as a growth substrate has not been revealed yet, but it is assumed that the surface of the growth substrate 11 is not precisely identical to the growth plane.

In comparison, with reference to FIG. 6(b), it can be seen that the n type GaN layer having a smooth surface was grown by using the middle temperature buffer layer 13. Namely, it is believed that since the middle temperature buffer layer 13 reduced the surface defect of the growth substrate 11, the crystallinity of the epitaxial layer formed thereon was improved.

Thus, it can be seen that, by growing the middle temperature buffer layer 13 at a temperature ranging from 700° C. to 800° C., the crystallinity of the epitaxial layer grown from the middle temperature buffer layer 13 at a high temperature of 900° C. or higher can be improved.

Experimental Example 2

Figure 7:
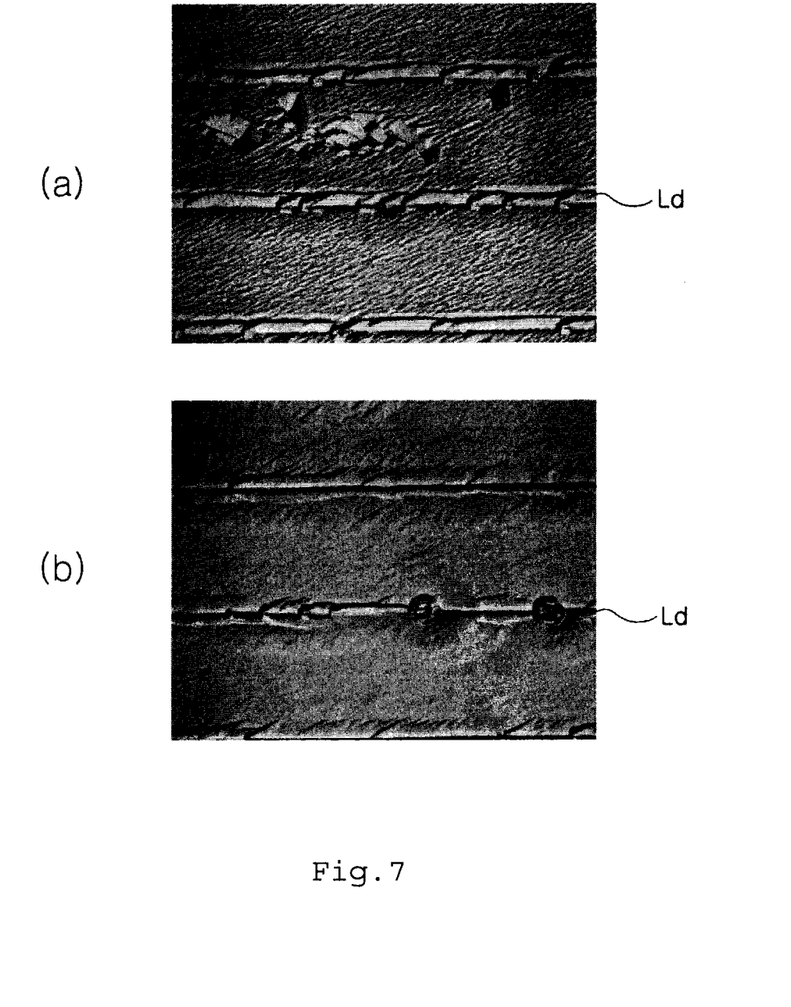
FIG. 7 is an optical photograph for explaining a surface morphology of an epitaxial layer according to the use of an intermediate layer.

FIG. 7 is an optical photograph for explaining a surface morphology of an epitaxial layer according to the use of an intermediate layer. In FIG. 7, (a) is a surface photograph of the p type contact layer 43 taken by an optical microscope after sequentially growing the n type contact layer 19, the super-lattice layer 20, the active layer 30, the p type clad layer 41, and the p type contact layer 43 from the gallium nitride substrate 11 without an intermediate layer, and (b) is a surface photograph of the p type contact layer 43 taken by an optical microscope after forming an $Al_{0.8}In_{0.2}N$ intermediate layer 17 having a thickness smaller than 10 nm between the lower GaN layer 15 and the n type contact layer 19 and then sequentially growing the super-lattice layer 20, the active layer 30, the p type clad layer 41, and the p type contact layer 43 from the n type contact layer 19. As the gallium nitride substrate 11, a c-plane growth substrate was used, and here, the substrate 11 had dislocation defective lines Ld formed to be parallel. The lower GaN layer 15 and the n type contact layer 19 were formed under the same growth conditions at a temperature ranging from about 1050° C. to 1100° C., and the intermediate layer 17 was grown at a temperature of about 830° C.

With reference to FIG. 7(a), when the intermediate layer 17 is not formed, the p type contact layer 43, a final epitaxial layer, was formed to have a very rough surface. The crystal defect lines Ld of the substrate 11 are transferred even to the p type contact layer 43 so as to be observed even from the surface. It is seen that the surface is inferior at the crystal defect lines Ld. In addition, it is seen that the surface between the crystal defect lines Ld is also very rough.

With reference to FIG. 7(b), when the intermediate layer 17 is formed, the surface between the crystal defect lines Ld is very smooth and the epitaxial layer is also grown to be clean even at the crystal defect lines Ld, in comparison to the case of FIG. 7(a).

Also, separated LEDs were fabricated on the gallium nitride substrate 11 and forward voltages according to the presence and absence of the intermediate layer 17 at a wafer level were compared. The results showed that the forward voltage of LEDs including the intermediate layer 17 was smaller by about 0.13V than that of the LEDs without the intermediate layer 17.

Experimental Example 3

Figure 8:
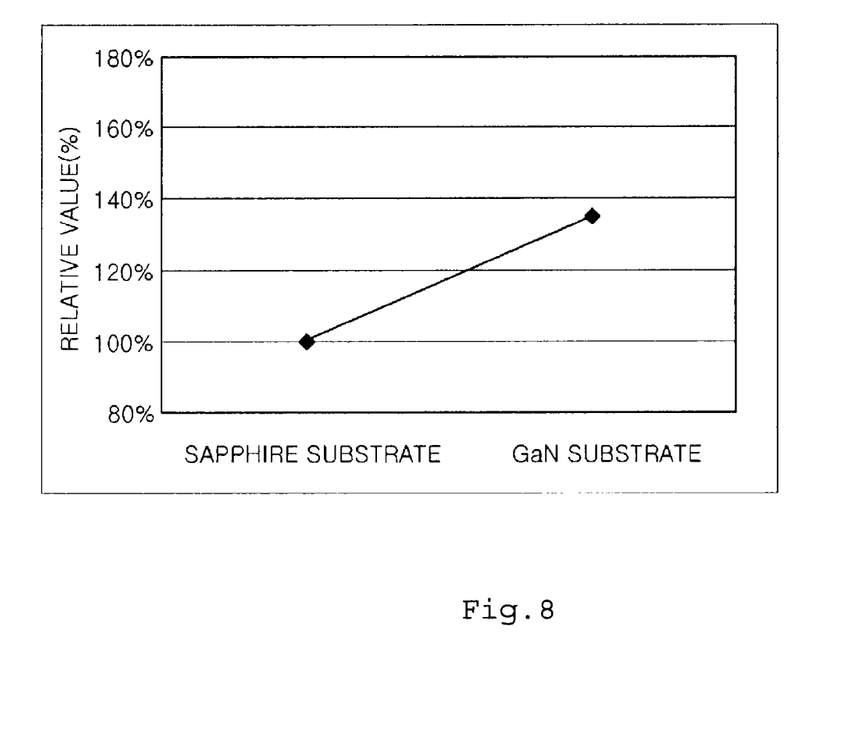
FIG. 8 is a graph for explaining an increase in optical power according to the use of a gallium nitride substrate.

FIG. 8 is a graph for explaining an increase in optical power according to the use of a gallium nitride substrate. Here, in an embodiment of the present invention, a c-plane gallium nitride substrate was used as a growth substrate and epitaxial layers were grown from the c-plane gallium nitride substrate to form an LED. Here, the super-lattice layer 20 was formed by repeatedly stacking InGaN and GaN in 20 cycles, and the well layer was formed as an InGaN layer emitting near ultraviolet rays, and the barrier layer was made of GaN. Meanwhile, in Comparative Example, a sapphire substrate was used as a growth substrate and an LED emitting near ultraviolet rays was formed on the sapphire substrate. Here, in order to check a change in optical power according to the difference between the growth substrates, the thicknesses of the barrier layers and the well layers were formed to be equal.

With reference to FIG. 8, in case of using the gallium nitride substrate, it was confirmed that 30% or more optical power was increased in comparison to the case of using the sapphire substrate. A change in the optical power according to the difference between the growth substrates was determined to be generated due to the difference in dislocation density within the epitaxial layer, in particular, within the active layer 30.

Experimental Example 4

Figure 9:
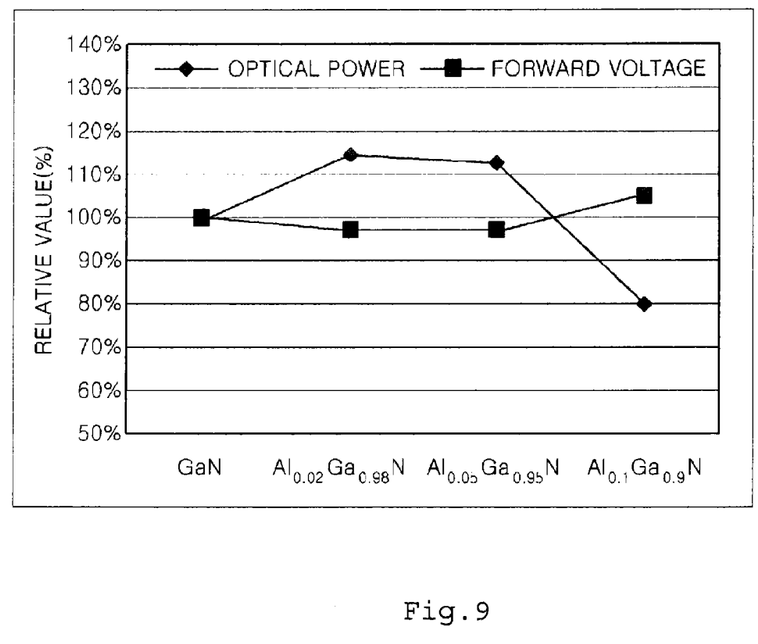
FIG. 9 is a graph for explaining a change in optical power and a forward voltage according to the composition ratio of Al in a barrier layer.

FIG. 9 is a graph for explaining a change in optical power and a forward voltage according to a composition ratio of Al in a barrier layer. Here, the gallium nitride substrate was used as a growth substrate, the barrier layer was made of AlGaN, optical power and a forward voltage according to the composition ratio of Al were measured by varying the composition ratio of Al, and relative values of the optical power and forward voltages were indicated by a percentage based on the LED using the GaN barrier layer.

With reference to FIG. 9, in comparison to the LED using the GaN barrier layer, when the AlGaN barrier layer having a composition ratio of Al ranging from 0.02 to 0.05 was formed, optical power was increased by 10% or more and the forward voltage was slightly reduced. Meanwhile, when the composition ratio of Al was increased to be 0.1, the optical power was rather reduced and the forward voltage was increased.

Thus, it can be seen that optical power of the LED can be improved by setting the composition ratio of Al in the barrier layer such that it ranges from about 0.02 to about 0.05.

According to embodiments of the present invention, since the gallium nitride substrate is employed, crystallinity of the semiconductor layers grown thereon can be improved, and in addition, since the super-lattice layer is disposed between the first contact layer and the active layer, a crystal defect that may be generated in the active layer can be prevented. Thus, luminous efficiency of the LED can be significantly enhanced, and the LED that can be driven under a high current by lowering dislocation density can be provided.

Also, since the super-lattice layer has the structure in which the InGaN layer, the AlGaN layer, and the GaN layer are repeatedly stacked in a plurality of cycles, electrons can be smoothly injected into the active layer and holes can be confined within the active layer. Thus, luminous efficiency can be improved without having to increase a driving voltage.

In addition, since the relatively thin barrier layers are disposed to be close to the p type contact layer, a forward voltage can be reduced without reducing luminous efficiency.

Also, since the middle temperature buffer layer and/or the intermediate layer are employed, a crystal defect can be further reduced.

Various embodiments and features have been described, but the present invention is not limited to the foregoing embodiments and features and may be variably modified, without departing from the spirit or scope of the present invention.

The invention claimed is:
1. A light emitting diode (LED) comprising:
a gallium nitride substrate having a growth plane of an m plane;
a gallium nitride-based first contact layer disposed on the gallium nitride substrate;
a gallium nitride-based second contact layer disposed at an upper portion of the first contact layer;
an active layer having a multi-quantum well structure and disposed between the first and second contact layers;
a super-lattice layer having a multilayer structure and disposed between the first contact layer and the active layer;
a middle temperature buffer layer positioned between the substrate and the gallium nitride-based first contact layer,
a lower GaN layer positioned between the substrate and the gallium nitride-based first contact layer; and
an intermediate layer positioned between the gallium nitride-based first contact layer and the lower GaN layer,
wherein the intermediate layer is an AlGaN layer,
wherein the middle temperature buffer layer is grown from the gallium nitride substrate at a growth temperature ranging from 700° C. to 800° C., and
wherein the gallium nitride substrate and the middle temperature buffer layer are formed of the same material.

2. The light emitting diode of claim 1, wherein the super-lattice layer having a multilayer structure has a structure in which an InGaN layer, an AlGaN layer, and a GaN layer are repeatedly stacked in a plurality of cycles.

3. The light emitting diode of claim 2, wherein the super-lattice layer having a multilayer structure further includes a GaN layer between the InGaN layer and the AlGaN layer in each cycle.

4. The light emitting diode of claim 1, wherein the active layer having a multi-quantum well structure includes (n−1) number of barrier layers disposed between a first well layer closest to the first n type contact layer and nth well layer closest to the second p type contact layer, and among the (n−1) number of barrier layers, barrier layers having a thickness greater than an average thickness of the (n−1) number of barrier layers are disposed to be closer to the first well layer and barrier layers having a thickness smaller than the average thickness of the (n−1) barrier layers are disposed to be closer to the nth well layer.

5. The light emitting diode of claim 4, wherein the number of barrier layers having a thickness greater than the average thickness is greater than that of the barrier layers having a thickness smaller than the average thickness.

6. The light emitting diode of claim 4, wherein the thickness of the respective well layers is smaller than that of the respective barrier layers which is smaller than the average thickness.

7. The light emitting diode of claim 4, wherein the thickness of the well layers positioned between the barrier layers having a thickness greater than the average thickness is equal to or greater than the thickness of the well layers positioned between the barrier layers having a thickness smaller than the average thickness.

8. The light emitting diode of claim 4, wherein the thickness of the well layers ranges from 10 Å to 30 Å.

9. The light emitting diode of claim 4, wherein barrier layers having a thickness greater than the average thickness of the (n−1) number of barrier layers have a thickness ranging from 50 Å to 70 Å.

10. The light emitting diode of claim 4, wherein barrier layers having a thickness smaller than the average thickness of the (n−1) barrier layers have a thickness ranging from 30 Å to 50 Å.

11. The light emitting diode of claim 1, wherein the barrier layers in the active layer are made of AlGaN or AlInGaN.

12. The light emitting diode of claim 11, wherein a composition ratio of aluminum (Al) in the barrier layers is greater than 0 and smaller than 0.1.

13. The light emitting diode of claim 12, wherein the composition ratio of aluminum (Al) in the barrier layers ranges from 0.02 to 0.05.

14. The light emitting diode of claim 1, wherein the middle temperature buffer layer has a thickness ranging from 2 nm to 10 nm.

* * * * *